(12) United States Patent
Farabegoli et al.

(10) Patent No.: US 9,806,929 B2
(45) Date of Patent: Oct. 31, 2017

(54) COMMUNICATION DEVICE WITH POWER AMPLIFIER CREST FACTOR REDUCTION

(71) Applicant: Intel IP Corporation, Santa Clara, CA (US)

(72) Inventors: Alessio Farabegoli, Unterhaching (DE); Bernhard Sogl, Unterhaching (DE); Jan-Erik Mueller, Ottobrunn (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/569,251

(22) Filed: Dec. 12, 2014

(65) Prior Publication Data

US 2016/0173311 A1    Jun. 16, 2016

(51) Int. Cl.
| | |
|---|---|
| *H04L 27/34* | (2006.01) |
| *H04L 27/26* | (2006.01) |
| *H04L 27/08* | (2006.01) |
| *H03F 1/02* | (2006.01) |
| *H03F 3/189* | (2006.01) |
| *H04B 1/04* | (2006.01) |

(52) U.S. Cl.
CPC ........... *H04L 27/2623* (2013.01); *H03F 1/02* (2013.01); *H03F 3/189* (2013.01); *H04L 27/08* (2013.01); *H04L 27/2614* (2013.01); *H04L 27/3411* (2013.01); *H04B 1/0475* (2013.01); *H04B 2001/0408* (2013.01)

(58) Field of Classification Search
CPC . H04L 27/2623; H04L 27/08; H04L 27/2614; H04L 27/3411; H03F 1/02; H03F 3/189; H04B 1/0475; H04B 1001/0408
USPC ....................... 455/127.1
See application file for complete search history.

(56) References Cited

U.S. PATENT DOCUMENTS

| | | | |
|---|---|---|---|
| 8,340,210 B2 * | 12/2012 | Haddad | ............... H04L 27/2624 375/259 |
| 8,340,645 B2 | 12/2012 | Baldwin et al. | |
| 8,446,979 B1 * | 5/2013 | Yee | ........ H04L 27/368 375/219 |
| 9,236,899 B2 * | 1/2016 | Fehri | ........ H04B 1/68 |
| 2006/0267688 A1 * | 11/2006 | Tanoue | ......... H03F 1/0261 330/278 |
| 2011/0258244 A1 | 10/2011 | Kang | |
| 2013/0082773 A1 * | 4/2013 | Yu | ......... H03F 1/3247 330/149 |
| 2013/0163512 A1 * | 6/2013 | Rexberg | ........ H04L 27/2624 370/328 |

(Continued)

FOREIGN PATENT DOCUMENTS

| | | |
|---|---|---|
| CN | 1297165 C | 1/2007 |
| CN | 105703715 A | 6/2016 |

(Continued)

OTHER PUBLICATIONS

"Comparison of PAR and Cubic Metric for Power De-Rating", 3GPP TSG RAN WG4, (May 10, 2004), 1-6.

(Continued)

*Primary Examiner* — Edward Urban
*Assistant Examiner* — Ralph H Justus
(74) *Attorney, Agent, or Firm* — Schwegman Lundberg & Woessner, P.A.

(57) ABSTRACT

Various embodiments include a power amplifier with crest factor reduction embodied by first circuitry for producing a correlated out-of-band noise signal for controlling the adjacent channel leakage ratio (ACLR) of a communication device; and second circuitry for providing an output signal for controlling the error vector magnitude (EVM) of a digital radio. The ACLR and the EVM are concurrently individually controllable. Additional apparatus is described.

27 Claims, 8 Drawing Sheets

(56) References Cited

U.S. PATENT DOCUMENTS

| | | | |
|---|---|---|---|
| 2013/0195221 A1* | 8/2013 | Lozhkin | H04B 1/0475 375/297 |
| 2014/0049843 A1* | 2/2014 | Kubota | G02B 9/62 359/757 |
| 2014/0169496 A1* | 6/2014 | Yang | H04B 1/0475 375/296 |
| 2014/0266460 A1* | 9/2014 | Nobbe | H03F 1/0261 330/295 |
| 2014/0269987 A1* | 9/2014 | Gubeskys | H04L 27/2624 375/296 |
| 2014/0341316 A1* | 11/2014 | Yu | H04L 27/2624 375/296 |
| 2014/0362951 A1* | 12/2014 | Fehri | H04L 27/2623 375/297 |

FOREIGN PATENT DOCUMENTS

| | | |
|---|---|---|
| EP | 1821474 A1 | 8/2007 |
| TW | 201042405 A1 | 12/2010 |
| TW | 201212595 A1 | 3/2012 |
| TW | 201631885 A | 9/2016 |

OTHER PUBLICATIONS

"European Application Serial No. 15194174.7, Extended European Search Report mailed May 11, 2016", 9 pgs.

Armstrong, J., "Peak-to-average power reduction for OFDM by repeated clipping and frequency domain filtering", Electronicsletters vol. 38 No. 5, (Feb. 2002), 246-247.

Baxley, Robert J., et al., "Constrained Clipping for Crest Factor Reduction in OFDM", IEEE Transactions on Broadcasting, vol. 52, No. 4, (Dec. 2006), 570-575.

Chen, Jau-Horng, et al., "A Crest Factor Reduction Technique for W-CDMA Polar Transmitters", IEEE, (2007), 345-348.

Masaki, Ojima, et al., "PAPR Reduction Method Using Clipping and Peak-Windowing in CI/OFDM System", Vehicular Technology Conference, 2007, VTC-2007 Fall 2007 IEEE 66th, IEEE, PI, (Sep. 1, 2007), 1356-1360.

Suraweera, Himal A., et al., "OFDM Peak-to-Average Power Reduction Scheme with Spectral Masking", 4 pgs.

Swaroop, Prem, et al., "Crest Factor Reduction through In-band and Out-of-band Distortion Optimization", IEEE, (2008), 759-762.

Vaananen, O., et al., "Simple algorithm for peak windowing and its application in GSM, EDGE andWCDMA systems", IEE Proc.-Commun., vol. 152, No. 3, (Jun. 2005), 357-362.

"European Application Serial No. 15194174.7, Response filed Dec. 15, 2016 to Extended European Search Report mailed May 11, 2016", 10 pgs.

"Taiwanese Application Serial No. 104136877, Office Action mailed Oct. 18. 2016", w/ English Translation, 15 pgs.

"Taiwanese Application Serial No. 104136877, Response filed Jan. 12, 2017 to Office Action mailed Oct. 18, 2016", W/ English Translation of Claims, 32 pgs.

"Taiwanese Application Serial No. 104136877, Office Action mailed Mar. 8, 2017", (English Translation), 13 pgs.

\* cited by examiner

COMMUNICATION DEVICE WITH POWER AMPLIFIER CREST FACTOR REDUCTION

FIELD

Embodiments described herein relate to crest factor reduction (CFR) for power amplifiers. Some embodiments relate to radio frequency (RF) power amplifiers in communication devices. Some embodiments relate to User Equipment (UE) in cellular networks, including $3^{RD}$ Generation Partnership Long Term Evolution (3GPP LTE) networks.

BACKGROUND

Many electronic devices, such as cellular phones and computers, usually include a power amplifier to boost a power level of a signal for various applications. The consumption of current in such devices is strongly dependent on the power amplifier. Consequently, the bias point of the power amplifier is usually chosen to obtain a target mean output power within desired linearity specifications and at the same time keep the peak-to-average power ratio (PAPR), or crest factor, low. Therefore it is desirable to have high CFR in a power amplifier design that will enable the bias point to be set near the optimum efficiency achievable by the power amplifier.

DETAILED DESCRIPTION

The electric current consumption of modern transmitter systems is strongly dependent on the power amplifier. In some applications, the bias point of the power amplifier is chosen in order to obtain a target mean output power keeping the linearity of the amplified signal within the 3GPP specifications. For non-constant envelope modulations like Wideband Code Division Multiple Access (WCDMA) or Orthogonal Frequency Division Multiplexing (OFDM), the high PAPR of the signals requires a bias point far from the optimum efficiency achievable by the power amplifier. Therefore, having a signal with lower PAPR, usually achieved by high CFR, and substantially the same data rate that is available without the CFR, directly translates into an efficiency advantage.

The Worldwide interoperability for Microwave Access (WiMAX), as currently defined by the Institute of Electrical and Electronics Engineers (IEEE) 802.16-series specification, uses orthogonal frequency division multiple access (OFDMA) in the uplink due to its generally outstanding properties and in order to simplify the overall standard by maintaining similarity with the downlink signal. In contrast, the LTE effort in the third generation partnership project, known as 3GPP, is contemplating the use of Single Carrier-Frequency Division Multiple Access (SC-FDMA) in the uplink while maintaining a choice of OFDMA for the downlink. The justification for choosing SC-FDMA over OFDMA in the LTE uplink was due to the PAPR issue discussed herein in terms of CFR. Consequently, power amplifiers that include the embodiments for CFR discussed herein may also find use in user equipment that is configured to operate in an LTE network or in another single network or multiple networks among the networks described herein (e.g., WiFi, WiMax, and other networks), including communication via OFDM and OFDMA.

While different kinds of techniques to reduce the high PAPR of WCDMA signals are known, most of them are based on a computationally intensive and iterative optimization of the baseband signal to avoid uncontrolled distortions when decreasing the peaks. These approaches are not suitable in handheld applications, where fast computation and easy hardware implementation are main key factors.

On the other hand, very easy approaches have also been developed. Some of them have been well-known for several years. The primary prior art approaches to crest factor reduction are peak windowing (or impulse injection) methods and filtering methods. However, a drawback of these approaches is that usually low CFR performance is achieved. Moreover, state of the art methods do not achieve a separate control for in-band and out-of-band distortions. Such separate control is important in multimode transmitter systems where, depending on the standard used, error vector magnitude (EVM) or adjacent channel leakage ratio (ACLR) is limiting factors (EVM for LTE, ACLR for WCDMA). Having a solution that is able to control EVM and ACLR separately at substantially the same time enhances the competitiveness of the product.

Each of the filtering and clipping approaches has its own strengths; in particular, peak windowing allows an easy control of the desired peak value, while filtering methods are more suitable to limit more precisely the out-of-band distortions. The selection of the optimum magnitude of threshold CL, and whether to apply the filter approach or the peak windowing approach, are selection problems, and a unique solution has not yet been found. While several studies are focused on a combination of methods to process in-band distortions and out-of-band spectral regrowth at the same time, good performance is nevertheless obtained at the cost of a greatly increased complexity of the system.

It is therefore desirable to establish a new CFR algorithm suitable for mobile system implementations that would include the possibility to independently and easily control both the ACLR and the EVM of the output digital signal.

Figure 1A:
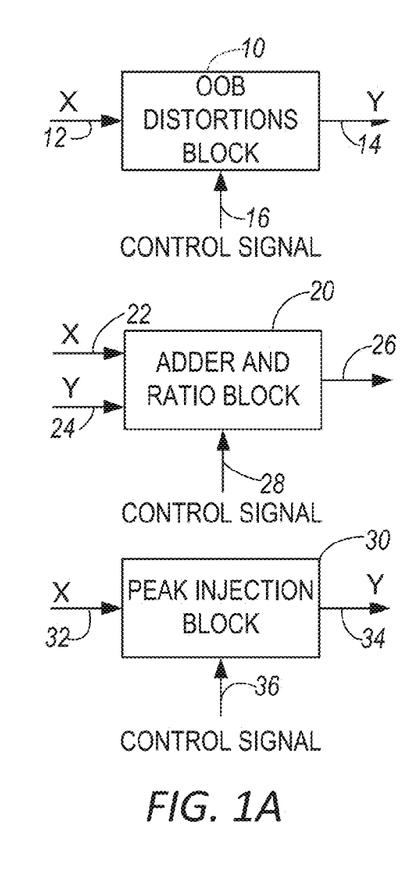
FIG. 1A illustrates a block diagram description of components of a crest factor reduction architecture, according to an embodiment.

FIG. 1A illustrates a block diagram description of components of a crest factor reduction architecture, according to an embodiment. Out-of-band (OOB) distortions block 10 blocks, isolates and enhances the out-of-band distortions of input signal X, 12, where "enhances" means that the out-of-band distortions block 10 has the capability to modify the mean power of the output signal. Out-of-band distortions block 10 provides, in one embodiment, single output signal Y, 14 which is a complex signal. In addition there is a control signal 16 to modify the internal parameters of out-of-band distortions block 10. Generally, out-of-band distortions block 10 may include a clipping component as discussed more fully below with respect to FIG. 1F. Control signal 16 may set the clipping threshold (CL) using a parameter such as α, discussed subsequently. Out-of-Band distortions block 10 may also include a filter component, and control signal 16 may be used to control filter parameters in order that a digital filter may be used which can be adapted to different signal bandwidths, not only for WCDMA, but also for long term evolution (LTE) with variable bandwidth. This would allow implementations with both a low pass filter, and an adder and high pass filter, to be employed. In addition, control signal 16 may control the mean power of the filtered signal.

Adder and ratio block 20 adds input signal X, 22, which may be the original signal X, 12, and input signal Y, 24 which may be signal Y, 14 from out-of-band distortion block 10, which signal contains the out-of-band distortions to the original signal X, 12. As used herein, "block" may mean an electronic circuit in some embodiments. Control signal 28 may set the ratio between the signal power and the distortion power, i.e., the power of signals 22 and 24. The ratio of the powers may be decided upon in order to obtain a certain adjacent channel leakage ratio (ACLR) in a communication device in which the described subject matter may be embodied. Obtaining the ACLR here is similar to the process performed by multiplier 125, with adder 130 of FIG. 1F, discussed below. However in the more general case of the adder and ratio block 20 of FIG. 1A, it is possible to leave the power of signal $Y_S$ of FIG. 1F as it is without multiplier 125, and instead change the power of the input signal X, 22.

Peak injection block 30 of FIG. 1A performs a peak injection using a selected peak function signal. It has two inputs: a complex signal X, 32 and a control signal 36. Control signal 36 may be used to define, or set, the impulse function used and the thresholds which can, for example, be defined by referring to the cubic metric (CM) of the signal, as discussed more fully for the embodiment of FIG. 1F, below The output signal Y, 34 is a complex signal.

Figure 1B:
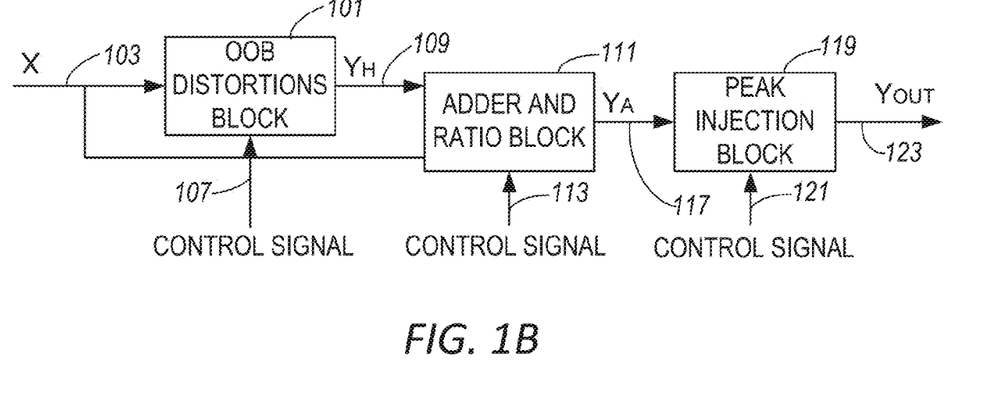
FIG. 1B is an illustration of a combination of the components of FIG. 1A according to an embodiment.
Figure 1C:
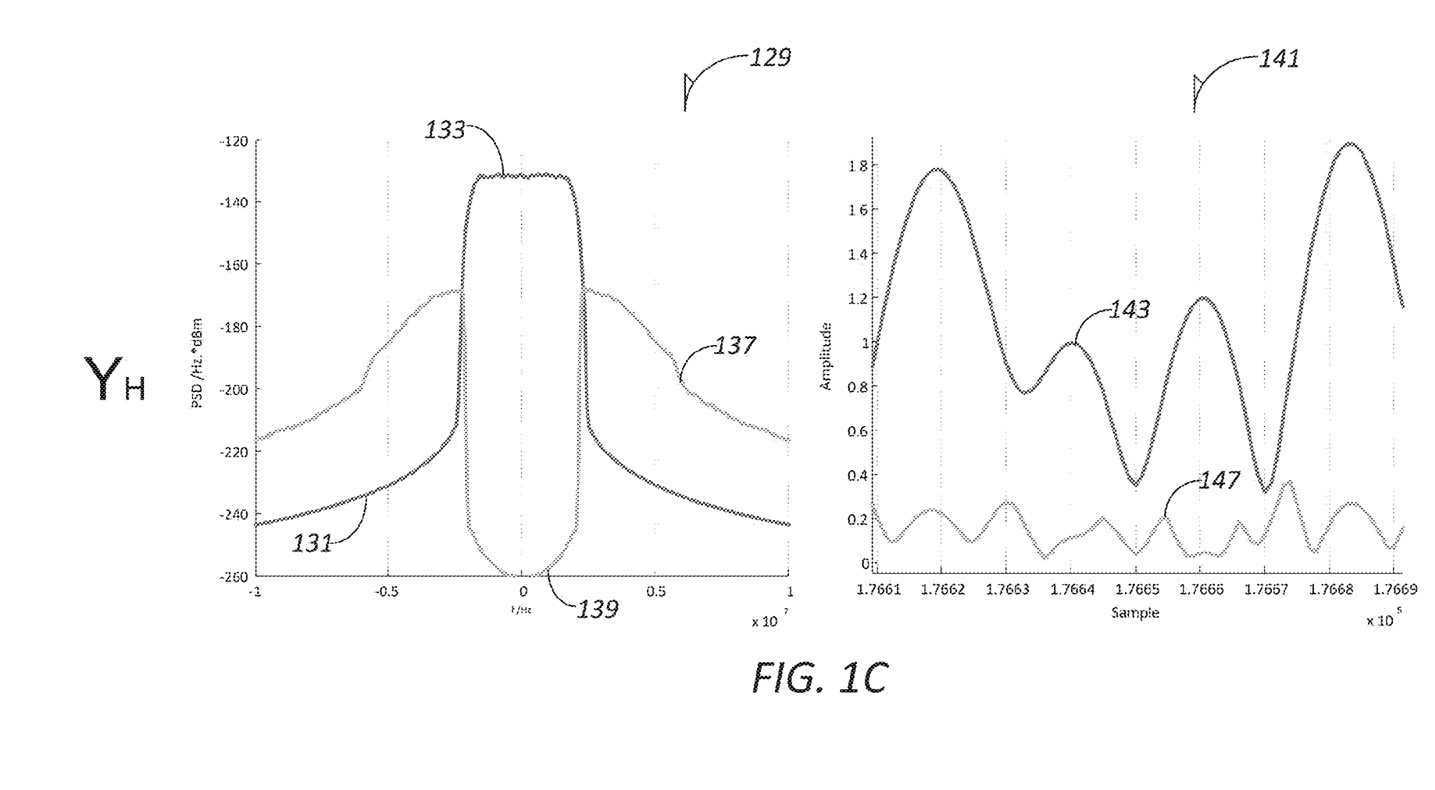
FIG. 1C illustrates the spectrum and time variation of the input and outputs signal of an out-of-band distortions block, according to an embodiment.

FIG. 1B is an illustration of a combination of the components of FIG. 1A according to an embodiment. OOB distortion block 101 of FIG. 1B has input signal X, 103 and provides output signal $Y_H$, 109, where the distortion is determined by control signal 107 as discussed earlier. FIG. 1C illustrates the spectrum and time variation of the input and outputs signal of an out-of-band distortions block, according to an embodiment. Signals X, 108, and $Y_H$, 109 of FIG. 1B are illustrated, respectively, at 129 and 141 of FIG. 1C. The vertical axes are, respectively, power spectral density (PSD)/Hz*dbm and amplitude, and the respective horizontal axes are frequency and time. At 129 of FIG. 1C signals 133, 131 are respective examples of the in-band and out-of-band spectra of signal X, 103. Signals 139, 137 are respective examples of the in-band and out-of-band spectra of signal $Y_H$, 109. At 141 of FIG. 1C, signal 143 is an example of the magnitude of signal X, 103 and signal 147 is an example of the magnitude of signal $Y_H$, 109 of FIG. 1B.

Figure 1D:
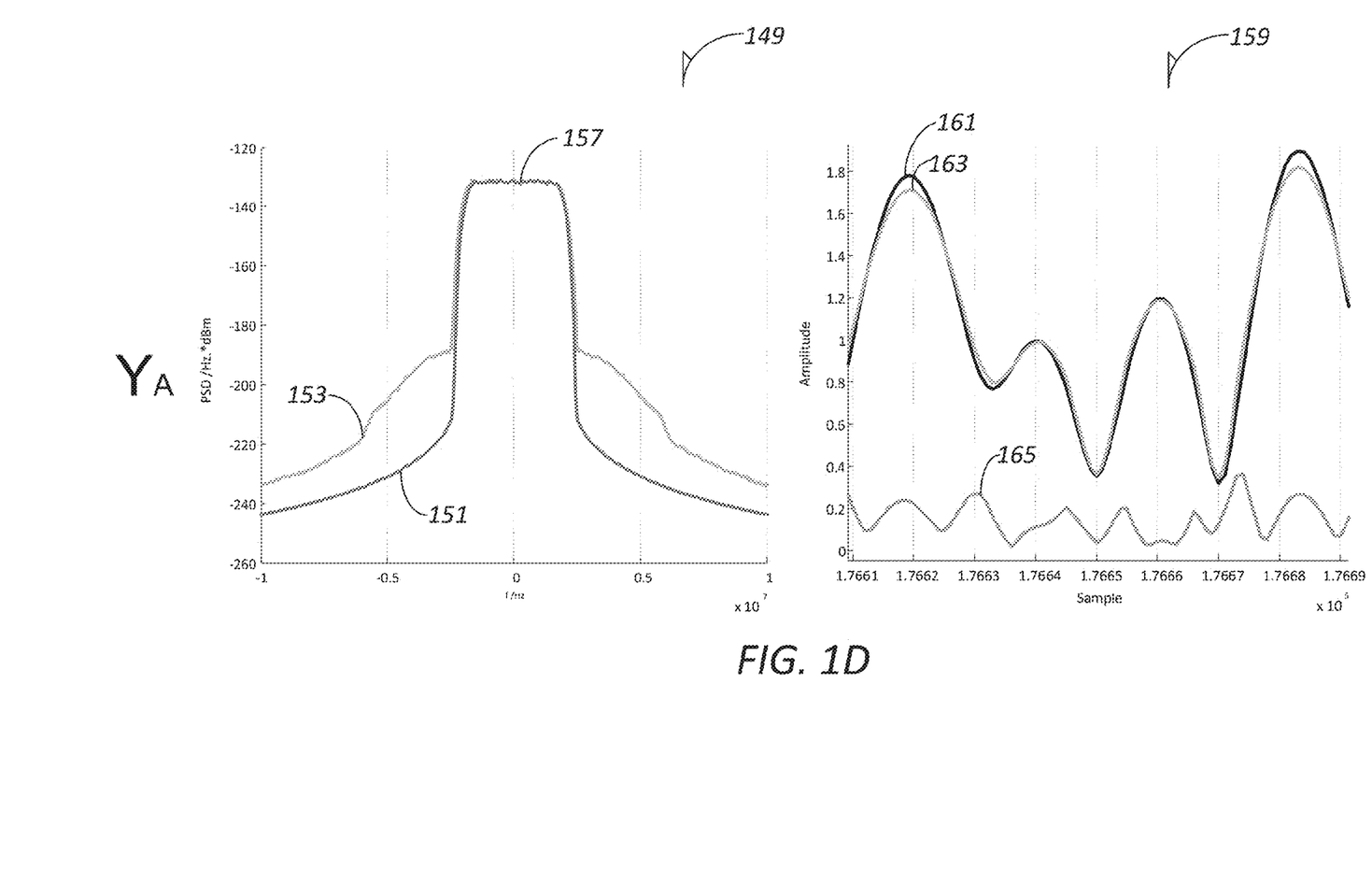
FIG. 1D is an example of the spectrum and of the envelope of the output signal of an adder and ratio block.

As previously explained, adder and ratio block 111 has as inputs complex signal $Y_H$, 109, and signal X, 103, which is also the original input signal to out-of-band distortions block 101. The output signal of adder and ratio block 111 is signal $Y_A$, 117. FIG. 1D is an example of the spectrum and of the envelope of the output signal of an adder and ratio block. The adder and ratio block is seen at 111 of FIG. 1B. At 149 of FIG. 1D the in-band and out-of band components 153, 157, respectively, of the spectrum of signal $Y_A$, are related to the in-band and out-of-band parts of signal X, 151, 157. As can be seen, essentially no modification is made in the spectrum for the in-band component. At 159 of FIG. 1D, an example of the envelope of signal $Y_A$, 163, is compared to signal X, 161, and the magnitude of $Y_H$, 165. The peaks of $Y_A$, 163, are lowered by adder and ratio block 111 compared to the peaks of input signal X, 161.

Figure 1E:
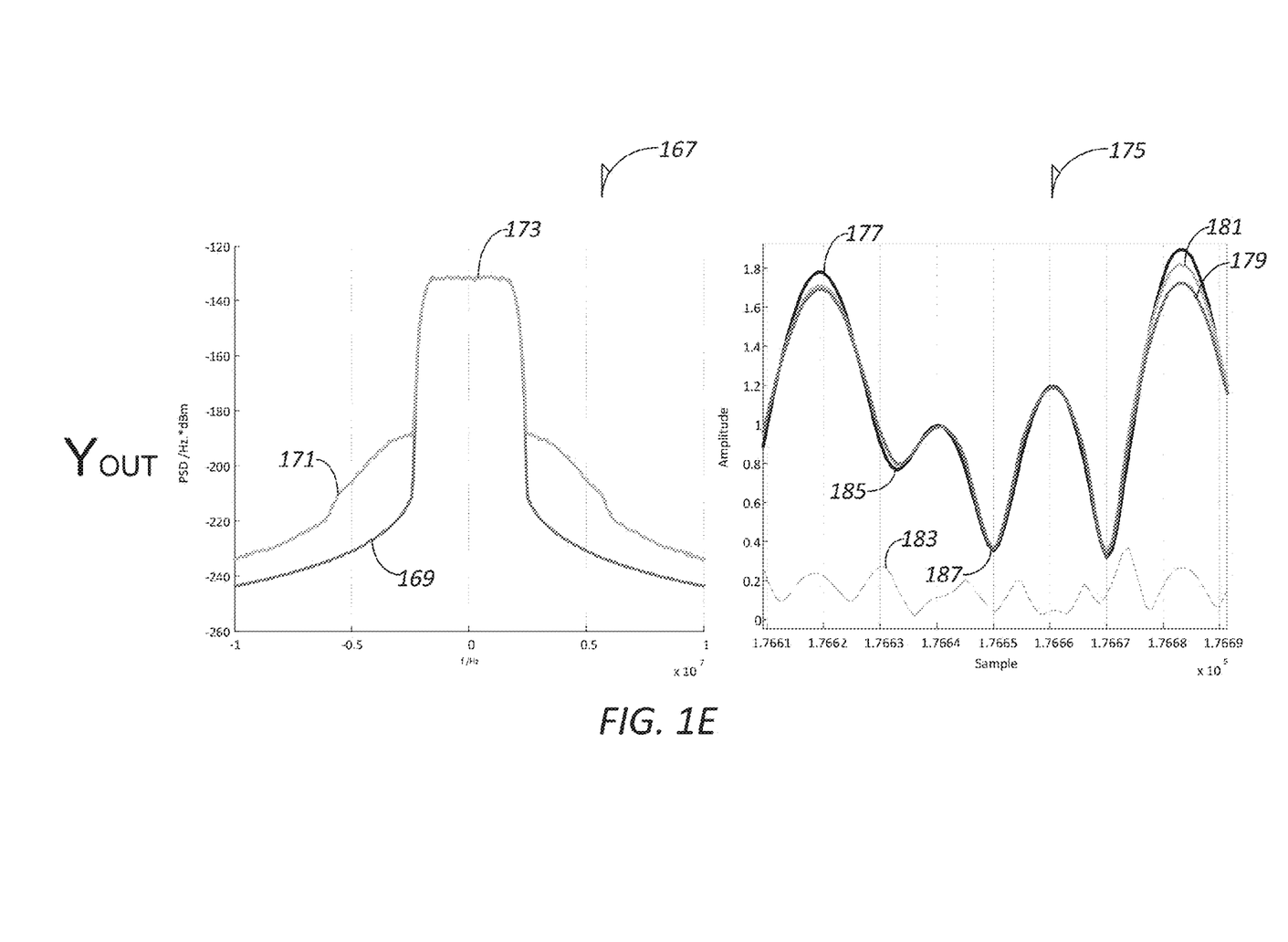
FIG. 1E is an example of a system input signal, and the input and output signals of a peak injection block, in both spectrum and magnitude, according to an embodiment.

Peak injection block 119 of FIG. B has input signal 117 which, in one embodiment, is signal $Y_A$, and control signal 121 to provide output signal $Y_{OUT}$, 123 with reduced crest factor. FIG. 1E is an example of a system input signal, and the input and output signals of a peak injection block, in both spectrum and magnitude, according to an embodiment. The illustrated signals of FIG. E are, respectively, signals X, 103, $Y_A$, 117, and $Y_{OUT}$, 123 of FIG. 1B. At 167 of FIG. 1E, signals 173 and 171 are, respectively, examples of in band and out-of-band energy of signal $Y_{OUT}$, 169, compared to in band and out-of-band band energy of signal X, 173. At 175 of FIG. 1E is illustrated an example of the magnitude of signals X, 177, $Y_A$, 181, $Y_{OUT}$, 179, and $Y_H$, 183. In particular, it can be noticed that the peaks of signal X, 177 are reduced a first time, (181), via the out-of-band distortions block 101 and a second time, (179), via the peak injection block 119.

Figure 1F:
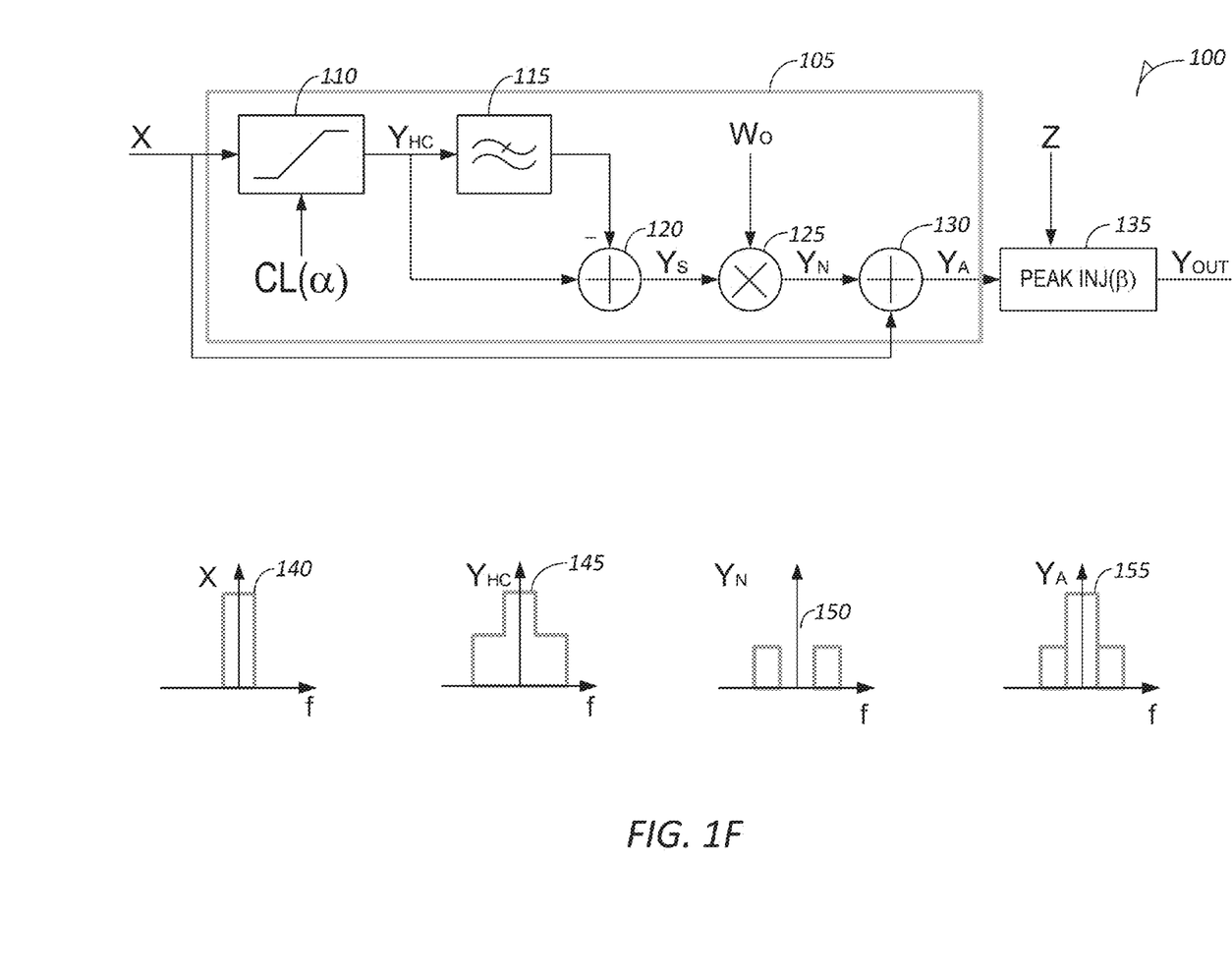
FIG. 1F illustrates a block diagram description of components of a crest factor reduction architecture for use in an embodiment.

FIG. 1F is a block diagram of a crest factor reduction architecture, according to an embodiment. The crest factor reduction architecture offers the ability to adjust in-band and out-of-band distortions independently. The baseband WCDMA input signal X is first processed in block 105, which implements a modified filtering approach. The ACLR, which may relate to leakage between adjacent channels of one or more digital radios in a communication device in which the CFR embodiments described herein may find use, may be precisely controlled in this first step by a high pass filter 115 in block 105, obtaining a first PAPR enhancement at output signal $Y_A$. A second step controls the EVM by adding an impulse function z to the magnitude of the signal $Y_A$ at 135. The impulse function z performs an in-band degradation of the signal. This means that the threshold of the signal's amplitude (β) can be directly related to the EVM degradation performed using the impulse function. Fixed values of α, β, related to the cubic metric (CM) of the signals can be selected. The CM is a figure of merit previously developed by Motorola. It is related to the PAPR of the signal. The CM was selected as an estimation parameter instead of PAPR since CM is a parameter given automatically when the signal is generated, and is a broadly used parameter in transmitter systems. CM is more related to the amount of distortion introduced by nonlinearities than is PAPR, and it is a parameter of the signal that is usually known from the baseband processor of the communication system in which the disclosed CFR embodiments may be used. While such fixed values are limited to WCDMA signals, it would be desirable to leave the selection of the peak function of the β values at 155 (discussed in detail subsequently) free. The function z may be selected in a way that minimizes the impact on the ACLR. Statistical investigations have led to a definition of optimum peak reduction depending on the CM of the signal. The injection of the function z was shown experimentally to allow a further PAPR reduction without exceeding the peak EVM specification of 17.5% at $Y_{OUT}$. Experimentally, the worst case was selected, taking the peak. Experimental studies described herein relate to WCDMA signals, but the principle can be extended to a more general case of WCDMA and LTE signals. In this case, the thresholds of α and β and $W_0$, discussed in detail below, may be redefined for the specifications needed, and this can be done with well-known analysis. The basic principle is to perform a clip and filtering of the signal as in FIG. 1F in order to generate a correlated out-of-band noise, enhance it to the amount needed (with $W_0$ at 125), and sum the result with the original signal X at 130 yielding signal $Y_A$, seen diagrammatically at 155, in order to change only the out-of-band distortions. Then the EVM is degraded using a peak injection method as at 135. For WCDMA signals, experimental results showed that a can be fixed having a similar noise for substantially all the signals. This behavior should also be the same for LTE, but for a more performant algorithm it would be good to leave the possibility to also optimize α.

Continuing with the description of the embodiment of FIG. 1F in additional detail, the baseband signal X, seen diagrammatically at 140, is modified by clipping at clipper 110, producing signal $Y_{HC}$, seen diagrammatically at 145 which, after further processing (described below), improves the PAPR by adding a noise signal that presents only out-of-band components. A coordinate rotation digital computer (CORDIC), which may follow a baseband processor in a communication device in which this architecture finds use, may be used to limit the magnitude of the input signal without affecting the phase. This operation generates strong distortions over the whole spectrum. The clipper limiter threshold (CL) deeply impacts the amount of noise generated. For this reason, several different WCDMA test cases have been evaluated to find the right value of α for the CL signal. CL may be defined in this instance as:

$$CL = \alpha \cdot RMS(X) \quad (1)$$

Figure 2:
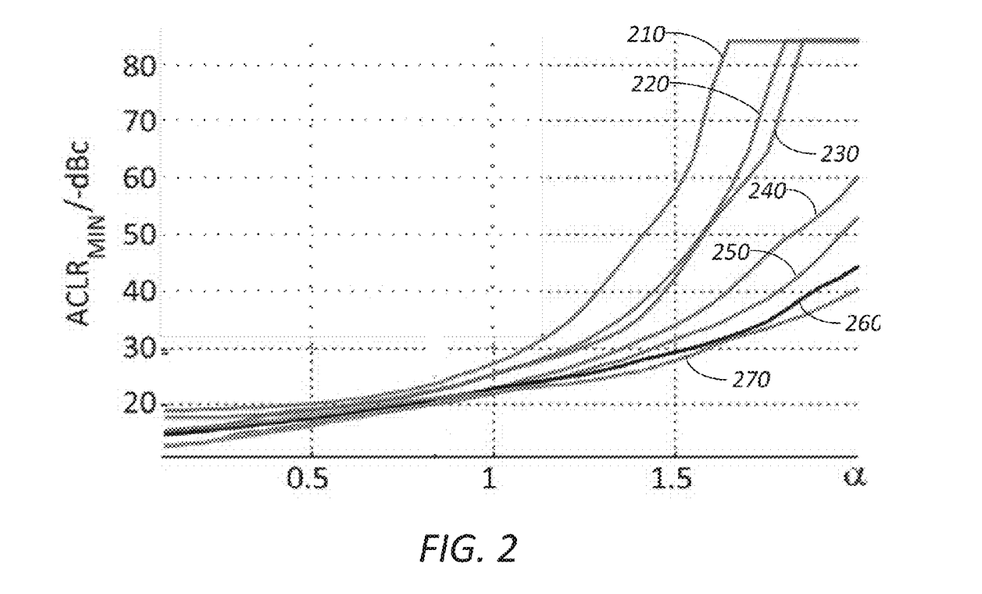
FIG. 2 illustrates the curves of adjacent channel leakage ratio versus a parameter, α, for various cubic metric test cases for the architecture of FIG. 1F, according to an embodiment.

Equation (1) links the value of α to the CL threshold. In general, the equation $CL=\alpha \cdot RMS|X|$ describes the relationship between the threshold CL and α. This variable α defines the clipping signal threshold. In particular, if the signals are normalized to their RMS value, which is usually the case, then α=CL. In FIG. 2, a database of approximately six hundred and ten WCDMA test cases was experimentally measured. The test cases were normalized to RMS(X)=1 and divided into groups according to their CM. Then, for each test case, the minimum ACLR obtained for different values of α was calculated. Experimentation indicated that substantially all the test cases have a value for α of approximately 0.7 where the ACLR is similar for all test cases. From that, it can be deduced that for WCDMA signals, this value could be fixed when it is desired to reduced the number of variables. Although for WCDMA signals a value of α of approximately 0.7 leads to a similar ACLR for all test cases, for a fine tuning of the algorithm, α should be adjustable.

FIG. 2 illustrates the curves of ACLR versus α for various CM test cases for the architecture of FIG. 1F, according to an embodiment, where substantially all the signals present a similar adjacent ACLR, independently of their CM. For curve identification in FIG. 2, the correlation of the CM test cases and the curves of FIG. 2 are seen in Table 1.

TABLE 1

The curves of FIG. 2 and their related test cases

| Curve | Test Cases |
|---|---|
| 210 | CM < 0.5 |
| 220 | 0.5 < CM < 1 |

TABLE 1-continued

The curves of FIG. 2 and their related test cases

| Curve | Test Cases |
|---|---|
| 230 | 1 < CM < 1.5 |
| 240 | 1.5 < CM < 2 |
| 250 | 2 < CM 2.5 |
| 260 | 2.5 < CM 3 |
| 270 | 3 < CM < 3.5 |

In order to isolate out-of-band distortions, a simpler implementation of highpass filtering can be done using a finite impulse response (FIR) such as high pass filter 115 and an adder 120 in FIG. 1F. The result is a noise signal $Y_S$ that contains only high frequency components. The multiplicative factor $W_0$ is used as an input to multiplier 125 to increase the power of signal $Y_S$. $Y_N$ (seen diagrammatically at 150) which is the signal $Y_S$ with a different mean power, has a power level which translates to an ACLR around −33 to −36 dBc for all test cases, independently by their proprieties. In this context, "independently of their properties," means that the constellation, number of data channels, PAPR and other signals properties (which are generally known in the baseband processor but not in the frontend) do not influence the value of $W_0$, since the optimum value of $W_0$ is influenced by the noise level generated by the clipping. As explained above, α and $W_0$ are two variables used to create a selected level of noise power. It would therefore be desirable to make the noise tunable. The values of ACLR=−33 to −36 dBc were selected as an example taken using the WCDMA linearity specification. These values are not necessarily to be used in the transmitter systems: in this case, after an estimation of the ACLR and EVM degradation is performed by the power amplifier, the algorithm should be adapted to the selected thresholds. For this reason the values $W_0$, α, and β should be left free to be adapted. Signals X and $Y_N$ are summed by adder 130, resulting in a signal with lower PAPR and degraded ACLR, but substantially without in-band distortions.

A peak windowing method is then used at 135 to further reduce the PAPR by inserting some in-band distortions, which affects the EVM. The injection of function z may be accurately selected in order to minimize the spectral regrowth. An impulse function with a bandwidth of 3.84 MHz may be used, windowed with a Hanning window. As seen in Table 1, the amount of out-of-band distortions inserted using the peak windowing method are far below the distortions generated by the modified filtering approach. The amount of distortions generated by the modified filtering approach are discussed above, where a threshold of −33 to −36 dBc of ACLR was selected. Usually, in circuit design, higher minimum values of ACLR will be selected (for example, around −40 dBc). But at the same time, lower thresholds for the EVM may also be selected. Therefore, it can be deduced that the amount of out-of-band distortions generated by the peak injection at 135 will be lower compared to what is generated by the clipping and filtering at 110, 115. Therefore, peak injection does not significantly impact the ACLR. The peak threshold CL strongly influences the EVM generated. In this case, the comparison between different test cases seen in FIG. 3 results in a different definition of CL:

$$CL = \beta \cdot MAX(|X|) \quad (2)$$

Figure 3:
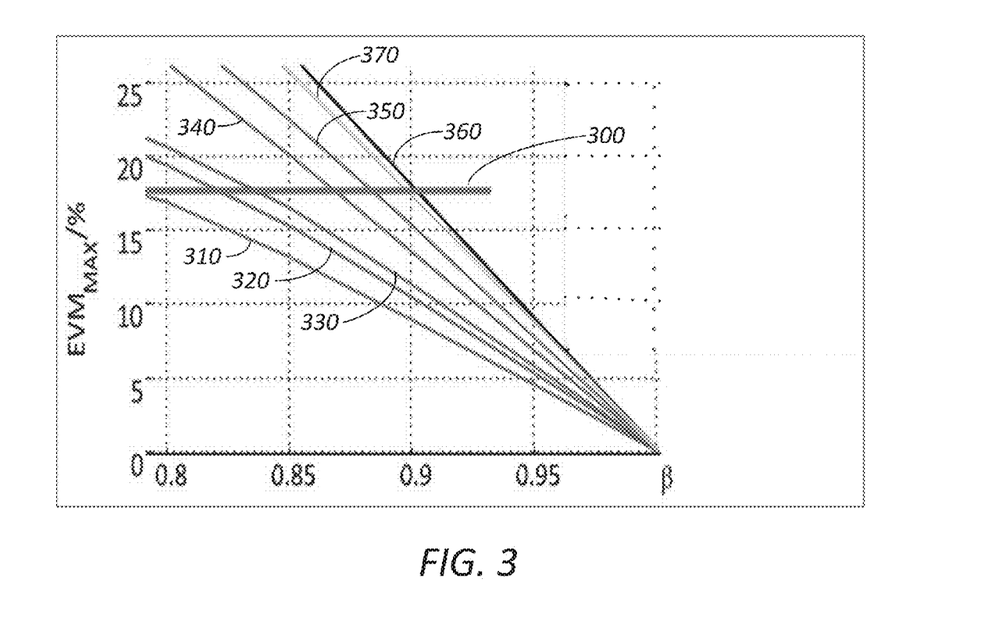
FIG. 3 illustrates curves of error vector magnitude versus a parameter, β, for various cubic metric test cases for the architecture of FIG. 1F, according to an embodiment.

FIG. 3 illustrates the curves of EVM versus β for various CM test cases for the architecture of FIG. 1F, and shows the impact of the variable β (and as a consequence of the threshold CL) on the peak EVM. In particular, it is shown that for the peak EVM threshold selected (horizontal line 300), the test cases can be grouped according to their CM. From this, values of β depending on the CM of the signals can be selected in order to obtain a certain peak EVM. To produce FIG. 3, the following procedure was performed:

a. The test cases were grouped according to their CM b. For each group, a sweep of β was done for each test case, and the resulting peak EVM was calculated. For each group, the worst case was taken and plotted using the curves 310-370 of FIG. 3 c. The point where each line intersects the horizontal line 300 is the value of β to be applied for the signals having this CM.

The correlation of the CM test cases and the curves of FIG. 3 are seen in Table 2.

TABLE 2

The curves of FIG. 3 and their related test cases

| Curves | Test Cases |
|---|---|
| 310 | CM < 0.5 |
| 320 | 0.5 < CM < 1 |
| 330 | 1 < CM < 1.5 |
| 340 | 1.5 < CM < 2 |
| 350 | 2 < CM 2.5 |
| 360 | 2.5 < CM 3 |
| 370 | 3 < CM < 3.5 |

FIG. 3 illustrates the dependency between β, EVM, and CM of the signal. Therefore, unlike for the peak windowing method alone, the PAPR of the output signal for the CFR described herein can be estimated a priori from the knowledge of its CM and selecting the right peak threshold through β as seen in Table 3.

TABLE 3

| CM | β | ACLR$_{MIN}$ |
|---|---|---|
| CM < 0.5 | 0.79 | −42 dBc |
| 0.5 < CM < 1 | 0.825 | −47 dBc |
| 1 < CM < 1.5 | 0.84 | −42 dBc |
| 1.5 < CM < 2 | 0.87 | −45 dBc |
| 2 < CM < 2.5 | 0.88 | −45 dBc |
| 2.5 < CM < 3 | 0.9 | −57 dBc |
| 3 < CM < 3.5 | 0.905 | −59 dBc |

Minimum ACLR obtained using the selected β values using the peak windowing method To illustrate the effectiveness of the disclosed embodiment, a database of 1220 different WCDMA signals was generated in the laboratory. The test cases differ with respect to constellation, PAPR, and numbers of coding channels. After applying the disclosed CFR method, 95.4% of test cases were observed to meet the EVM and ACLR requirements and, using relaxed constraints, it is possible to extend that to the whole database.

Figure 4:
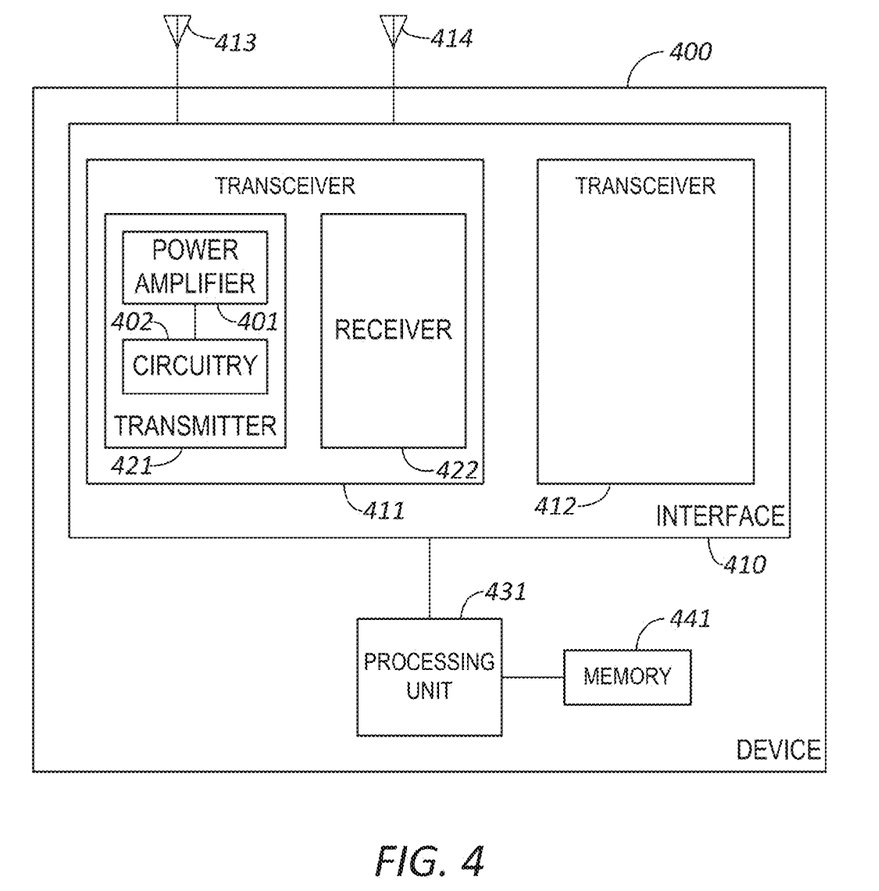
FIG. 4 is a block diagram of UE, according to an embodiment.

FIG. 4 shows a block diagram of UE, according to an embodiment. UE 400 includes an interface 410, according to some embodiments described herein. UE 400 may include power amplifier 401, which includes at least one CFR embodiment described above with reference to FIG. 1F. As shown in FIG. 4, user equipment may also include antennas 413 and 414, a processing unit 431, and a memory 441. For simplicity, FIG. 4 omits other elements of device 400 in order not to obscure the embodiments described herein. For example, device 400 may include one or more of a keyboard, a display (e.g., an LCD screen including a touch screen), a non-volatile memory port (e.g., a Universal Serial Bus (USB) port), a graphics processor, an application processor, speakers, and other elements.

User equipment 400 may include a portable wireless communication device, such as a personal digital assistant (PDA), a laptop or portable computer with wireless communication capability, a web tablet, a wireless telephone, a wireless headset, a pager, an instant messaging device, a digital camera, an access point, a television, a medical device (e.g., a heart rate monitor, a blood pressure monitor, etc.), or other device that may receive and/or transmit information wirelessly.

Processing unit 431 and interface 410 of user equipment 400 may be configured to communicate with a single type of communication network or multiple types of communication networks. For example, processing unit 431 and interface 410 may be configured to communicate with one or more of WiFi, WiMax, LTE, and other communication networks.

Processing unit 431 may include a single processor or multiple processors. The processor or processors may include one or more general purpose processors, one or more application-specific integrated circuits (ASICs), or other types of processors. Processing unit 431 may configure messages for transmission by interface 410 to other devices. Processing unit 431 may be configured to communicate with the interface 410 to wirelessly exchange messages with other devices.

Memory 441 may include volatile memory, non-volatile memory, or a combination of both. Memory 441 may contain instructions (e.g., firmware programs, software programs, or a combination of both), which when executed by processing unit 431 result in UE performing operations. Such operations may include wirelessly transmitting, receiving, or both, signals to or from user equipment through antennas 413 and 414.

As shown in FIG. 4, interface 410 may include transceivers 411 and 412, each of which may be configured to communicate with a different network. For example, transceiver 411 may be configured to communicate with an LTE network, and transceiver 412 may be configured to communicate with a WiMax network. FIG. 4 shows an example where UE includes two transceivers (e.g., 411 and 412) and two antennas (e.g., 413 and 414). However, the number of transceivers and antennas may vary.

Transceiver 411 may include a transmitter 421 and a receiver 422 to wirelessly exchange (e.g., send and receive) messages with other devices (not shown in FIG. 4) through at least one of antennas 413 and 414 in at least one of the networks described above. Transceiver 412 may also include a transmitter and a receiver (not shown in FIG. 4) to wirelessly exchange messages with other devices through at least one of antennas 413 and 414.

At least one of transceivers 411 and 412 may include a power amplifier. For example, transmitter 421 of transceiver 411 may include power amplifier 401. As stated above, power amplifier 401 may include one or more CFR embodiments described above with reference to FIG. 1F.

As shown in FIG. 4, transmitter 421 may include circuitry 402 to generate signals for transmission. Power amplifier 401 may receive signals (e.g., input signals) generated by circuitry 402 and provide signals (e.g., output signals) to at least one of antennas 413 and 414 for transmission. The signals (e.g., input signals) received by power amplifier 401 may include signals similar to or identical to signal X received by the CFR embodiments for power amplifiers such as 401 described above with reference to FIG. 1F. Thus, the signals (e.g., output signals) provided by power amplifier 401 to antennas 413 and 414 may include signals similar to or identical to signals $Y_{OUT}$ provided as the output of FIG. 1F.

Transmitter 421 of transceiver 411 in FIG. 4 may include an OFDM transmitter, such that at least one of the signals generated by circuitry 402 may include an OFDM signal. In some embodiments, transmitter 421 may also include an OFDMA transmitter, such that at least one of the signals generated by circuitry 402 may include an OFDMA signal. UE 400 may be configured to operate in a multiple-input multiple-output (MIMO) configuration. Thus, power amplifier 401 may be coupled to multiple antennas of user equipment 400 (e.g., at least antennas 413 and 414) for MIMO transmissions. The signals generated by circuitry 402 may include preceded OFDM signals, and also OFDMA signals for MIMO transmissions.

Further, transmitter 421 may also include a MIMO transmitter arranged to transmit OFDM signals or OFDMA signals over an uplink channel using a plurality of antenna ports (e.g., antenna ports associated with antennas 413 and 414). The MIMO transmitter may include at least one RF power amplifier (e.g., power amplifier 401) associated with each of the antenna ports.

In FIG. 4, antennas 413 and 414 may include one or more directional or omnidirectional antennas, including, for example, dipole antennas, monopole antennas, patch antennas, loop antennas, microstrip antennas or other types of antennas suitable for transmission of RF signals. In some embodiments, instead of two or more antennas, a single antenna with multiple apertures may be used. In such embodiments, each aperture may be considered a separate antenna. In some MIMO embodiments, the device antennas may be effectively separated to take advantage of spatial diversity and the different channel characteristics that may result between each of antennas of the device and the antennas of a transmitting station. In some MIMO embodiments, the antennas may be separated by up to 1/10 of a wavelength or more.

Figure 5:
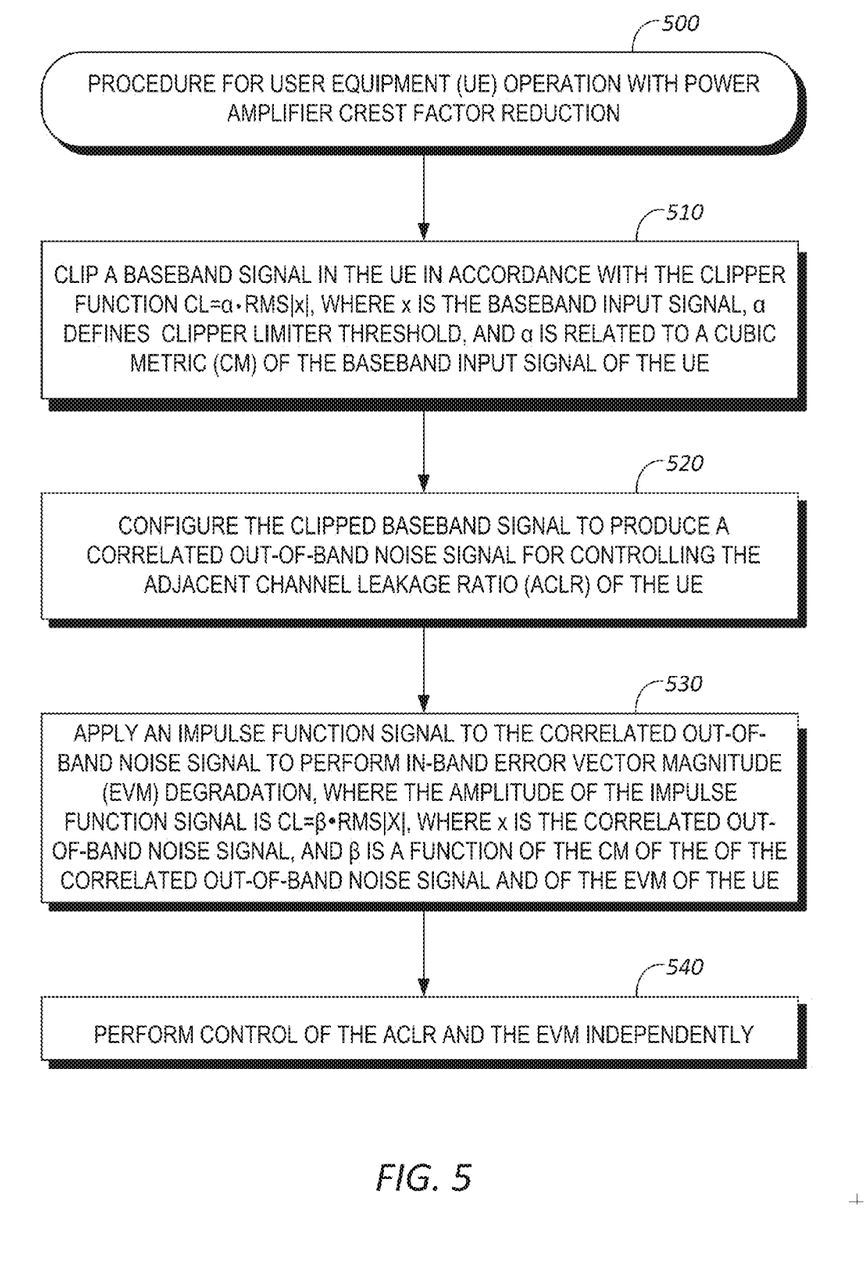
FIG. 5 is an illustration of a method of operating UE, according to an embodiment.

FIG. 5 is an illustration of a method according to an embodiment. FIG. 5 shows a method 500 of UE operation with a power amplifier that employs crest factor reduction. At 510 a baseband signal of the UE is clipped in accordance with a clipper function of the form CL=α·rms|x|, where x is the baseband input signal, α defines clipper limiter threshold, and α is related to the CM of the baseband input signal of the UE. At 520 the clipped baseband signal is configured to produce a correlated out-of-band noise signal for controlling the ACLR of the UE. At 530 an impulse function is applied to the correlated out-of-band noise signal, where the amplitude of the impulse function signal is cl=βrms|x|, where x is the correlated out-of-band noise signal, and β is a function of the CM of the correlated out-of-band noise signal and of the EVM of the UE. The EVM and the ACLR may be controlled independently.

EXAMPLES

In Example 1 a power amplifier comprises first circuitry configured to employ a clipping function to produce a correlated out-of-band noise signal to control adjacent channel leakage ratio (ACLR) of a communication device, and second circuitry coupled to the first circuitry and configured to apply an impulse function signal to the correlated out-of-band noise signal to control error vector magnitude (EVM) of the communication device.

In Example 2, the first circuitry of Example 1 optionally comprises a clipper circuit, a highpass filter, and a multiplier.

In Example 3, in the power amplifier of any one or more of Examples 1-2, the clipper circuit can optionally receive a baseband input signal and produce a clipper circuit output signal, the highpass filter can optionally receive the clipper circuit output signal and produce a highpass filter output signal, and the first circuitry can optionally further comprise a first adder to add the clipper circuit output signal and the highpass filter output signal to produce a multiplier input signal.

In Example 4, the multiplier of any one or more of Examples 1-3 can optionally produce, responsive to the multiplier input signal, a multiplier output signal for increasing the power of the correlated out-of-band noise signal to a level that translates to an ACLR ranging from approximately −33 dBc to −36 dBc.

In Example 5 the first circuitry of any one or more of Examples 1-4 optionally includes a second adder to add the multiplier output signal and the baseband input signal to produce the correlated out-of-band noise signal for controlling the ACLR of the communication device.

In Example 6, the clipper circuit of any one or more of Examples 1-5 optionally receives a baseband input signal and clips the baseband input signal in accordance with a clip signal of the form CL=α·RMS|X|, where X is the baseband input signal, α defines the clipper limiter threshold of CL, and α is related to the cubic metric (CM) of the baseband input signal.

In Example 7, the second circuitry of any one or more of Examples 1-6 optionally comprises circuitry for applying an impulse function signal to the correlated out-of-band noise signal to perform in-band EVM degradation.

In Example 8, the impulse function signal of any one or more of Examples 1-7 optionally has an amplitude CL=β·RMS|X|, where X is the output signal from the first circuitry, and β is a function of the CM of the correlated out-of-band noise signal and of the EVM of the communication device.

In Example 9, the first circuitry and the second circuitry of any one or more of Examples 1-8 are optionally coupled to mobile communication device circuitry, the mobile communication device circuitry configured to generate orthogonal frequency division multiple access (OFDMA) signals.

In Example 10, the ACLR and the EVM of any one or more of Examples 1-9 optionally are concurrently individually controllable.

In Example 11, an orthogonal frequency division multiplexing (OFDM) transmitter comprises Fast Fourier Transform circuitry to generate at least one OFDM signal for transmission, and a power amplifier to amplify the at least one OFDM signal, the power amplifier comprising first circuitry configured to employ a clipping function to produce a correlated out-of-band noise signal to control ACLR of the OFDM transmitter, and second circuitry coupled to the first circuitry and configured to apply an impulse function to the correlated out-of-band noise signal to control EVM of the OFDM transmitter.

In Example 12, the first circuitry of Example 11 optionally comprises a clipper circuit, a highpass filter, and a multiplier.

In Example 13, in the OFDM transmitter of any one or more of Examples 11-12, the clipper circuit can optionally receive a baseband input signal and produce a clipper circuit output signal, the highpass filter can optionally receive the clipper circuit output signal and produce a highpass filter output signal, and the first circuitry can optionally further comprise a first adder to add the clipper circuit output signal and the highpass filter output signal to produce a multiplier input signal.

In Example 14, the multiplier of any one or more of Examples 11-13 can optionally produce, responsive to the multiplier input signal, a multiplier output signal for increasing the power of the correlated out-of-band noise signal to a level which translates to an ACLR ranging from approximately −33 dBc to −36 dBc.

In Example 15, the first circuitry of any one or more of Examples 11-14 optionally comprises a second adder to add the multiplier output signal and the baseband input signal to produce the correlated out-of-band noise signal for controlling the ACLR of the OFDM transmitter.

In Example 16, the clipper circuit of any one or more of Examples 11-15 can optionally clip the baseband input signal in accordance with a clip signal of the form $CL=\alpha \cdot RMS|X|$, where X is the baseband input signal, $\alpha$ defines the clipper limiter threshold of CL, and $\alpha$ is related to the cubic metric (CM) of the baseband input signal.

In Example 17, the multiplier of any one or more of Examples 11-16 can optionally increase the power of the correlated out-of-band noise signal to a level which translates to an ACLR ranging from approximately −33 dBc to −36 dBc.

In Example 18, the second circuitry of any one or more of Examples 11-17 optionally comprises circuitry for applying an impulse function signal to the correlated out-of-band noise signal for in-band EVM degradation.

In Example 19, the amplitude of the impulse function signal of any one or more of Examples 11-18 is optionally $CL=\beta \cdot RMS|X|$ where X is the output signal from the first circuitry and $\beta$ is a function of the CM of the correlated out-of-band noise signal and of the EVM of the transmitter.

In Example 20, the first circuitry and the second circuitry of any one or more of Examples 11-19 are optionally coupled to mobile communication device circuitry, the mobile communication device circuitry configured to generate OFDM signals.

In Example 21, the ACLR and the EVM of any one or more of Examples 11-20 are optionally concurrently individually controllable.

In Example 22, the OFDM transmitter of any one or more of Examples 11-21 is optionally part of user equipment configured to operate in a long term evolution (LTE) network.

In Example 23, the transmitter of any one or more of Examples 11-22 can optionally comprise one or more antennas configured for transmission of the at least one OFDM signal.

In Example 24, a method of operating user equipment (UE) comprises producing, by a clipping signal, a correlated out-of-band noise signal for controlling adjacent channel leakage ratio (ACLR) of the UE, and providing, by applying an impulse function signal to the correlated out-of-band noise signal, a signal to control error vector magnitude (EVM) of the UE.

In Example 25, the method of Example 24 can optionally further comprise providing a clipping signal configured to clip a baseband input signal in accordance with a function $CL=\alpha \cdot RMS|x|$, where x is the baseband input signal, $\alpha$ defines a clipper circuit limiter threshold, and $\alpha$ is related to a cubic metric (CM) of the baseband input signal.

In Example 26, the method of any one or more of Examples 24-25, can optionally further comprise increasing the power of the correlated out-of-band noise signal to a level corresponding to an ACLR ranging from approximately −33 dBc to −36 dBc.

In Example 27, method of any one or more of Examples 24-26 can optionally further comprise applying the impulse function signal to the correlated out-of-band noise signal to perform in-band EVM degradation, the amplitude of the impulse function signal being $CL=\beta \cdot RMS|x|$, where x is the correlated out-of-band noise signal from the first circuitry, and $\beta$ is a function of the CM of the of the correlated out-of-band noise signal and of the EVM of the UE.

In Example 28, a crest factor reduction apparatus comprises an out-of-band (OOB) distortions circuit for isolating and enhancing out-of-band distortions of a first input signal and providing a first complex signal, an adder and ratio circuit coupled to the OOB distortions circuit for adding the first input signal and the first complex signal, the adder and ratio circuit configured to obtain a desired adjacent channel leakage ratio (ACLR) in a communication device by setting a ratio of power of the first input signal to power of the first complex signal, and a peak injection circuit coupled to the adder and ratio circuit to receive a second complex signal from the adder and ratio circuit, the peak injection circuit for using a peak function signal to control error vector magnitude (EVM) of the communication device.

In Example 29, the peak function injection circuit of the crest factor reduction apparatus of Example 28 can optionally receive a control signal to define the impulse function signal as a function of a CM of the second complex signal.

In Example 30, the crest factor reduction apparatus of any one or more of Examples 28 and 29 can optionally include the ACLR and the EVM being independently controllable.

Example 31 can include, or can optionally be combined with any portion or combination of any portions of any one or more of Examples 1 through 30 to include, subject matter that can include means for performing any one or more of the functions of Examples 1 through 30, or a machine-readable medium including instructions that, when performed by a machine, cause the machine to perform any one or more of the functions of Examples 1 through 30.

Although UE is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, ASICs, radio-frequency integrated circuits (RFICs), and combinations of various hardware and logic circuitry for performing at least the functions described herein. In some embodiments, the functional elements may refer to one or more processes operating on one or more processing elements.

Embodiments described herein may be implemented in one or a combination of hardware, firmware, and software. Embodiments described herein may also be implemented as instructions stored on a computer-readable storage medium, which may be read and executed by at least one processor to perform the operations described herein. A computer-readable storage medium may include any non-transitory or other mechanism for storing information in a form readable by a machine (e.g., a computer). For example, a computer-readable storage medium may include read-only memory (ROM), random-access memory (RAM), magnetic disk storage media, optical storage media, flash-memory devices, and other storage devices and media. In these embodiments, one or more processors of user equipment may be configured with the instructions to perform the operations described herein.

The above description and the drawings illustrate some embodiments to enable those skilled in the art to practice the embodiments disclosed. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description. Therefore, the scope of various embodiments disclosed is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A power amplifier comprising:
   a clipper circuit for receiving a baseband signal, the clipper circuit configured to produce a correlated out-of-band noise signal, said clipper circuit further configured to control the adjacent channel leakage ratio (ACLR) of a communication device based on a clipper limiter threshold of the clipper circuit; and
   a peak injection circuit coupled to the clipper circuit for receiving said correlated out-of-band noise signal, the peak injection circuit configured to apply an impulse function signal to the correlated out-of-band noise signal, said peak injection circuit further configured to control the error vector magnitude (EVM) of the communication device based on a peak threshold of the peak injection circuit,
   wherein ACLR and EVM are independently controllable.

2. The power amplifier of claim 1, wherein the clipper circuit is configured to generate a clipping function and is coupled to a high-pass filter and a multiplier, wherein the ACLR is further controllable by a multiplicative factor of the multiplier.

3. The power amplifier of claim 2, wherein the clipper circuit is configured to receive a baseband input signal and produce a clipper circuit output signal based on the clipper limiter threshold, the high-pass filter is configured to receive the clipper circuit output signal and produce a high-pass filter output signal, and a first adder, configured to add the clipper circuit output signal and the high-pass filter output signal to produce a multiplier input signal, is coupled to the clipper circuit.

4. The power amplifier of claim 3, wherein, responsive to the multiplier input signal, the multiplier is configured to produce a multiplier output signal to increase the power of the correlated out-of-band noise signal to a level corresponding to an ACLR ranging from about −33 dBc to about −36 dBc.

5. The power amplifier of claim 4, wherein the clipper circuit is further coupled to a second adder to add the multiplier output signal and the baseband input signal to produce the correlated out-of-band noise signal to control the ACLR of the communication device.

6. The power amplifier of claim 1, wherein the peak injection circuit comprises circuitry configured to apply an impulse function to the correlated out-of-band noise signal to perform in-band EVM degradation.

7. The power amplifier of claim 6, wherein the peak injection circuit has a peak threshold $CL=\beta$ MAX $(|X|)$, where X is a baseband input signal, and $\beta$ is a function of a cubic metric (CM) of the correlated out-of-band noise signal and of the EVM of the communication device.

8. The power amplifier of claim 1, wherein the clipper circuit and the peak injection circuit comprise mobile communication device circuitry, and the mobile communication device circuitry is configured to generate orthogonal frequency division multiple access (OFDMA) signals.

9. A transmitter comprising:
   a circuitry to generate at least one multiplexed signal for transmission; and
   a power amplifier to amplify the at least one multiplexed signal, the power amplifier comprising:
   a clipper circuit for receiving a baseband signal, the clipper circuit configured to produce a correlated out-of-band noise signal, said clipper circuit further configured to control the adjacent channel leakage ratio (ACLR) of a communication device based on a clipper limiter threshold of the clipper circuit; and
   a peak injection circuit coupled to the clipper circuit for receiving said correlated out-of-band noise signal, the peak injection circuit configured to apply an impulse function signal to the correlated out-of-band noise signal, said peak injection circuit further configured to control the error vector magnitude (EVM) of the communication device based on a peak threshold of the peak injection circuit,
   wherein ACLR and EVM are independently controllable.

10. The transmitter of claim 9, wherein the clipper circuit is configured to generate a clipping function, and is coupled to a high-pass filter and a multiplier, wherein the ACLR is further controllable by a multiplicative factor of the multiplier.

11. The power amplifier of claim 10, wherein the clipper circuit is configured to receive a baseband input signal and produce a clipper circuit output signal based on the clipper limiter threshold, the high-pass filter is configured to receive the clipper circuit output signal and produce a high-pass filter output signal, and a first adder is coupled to the clipper circuit and the filter, and is configured to add the clipper circuit output signal and the high-pass filter output signal to produce a multiplier input signal.

12. The transmitter of claim 11, wherein, responsive to the multiplier input signal, the multiplier produces a multiplier output signal to increase the power of the correlated out-of-band noise signal to a level corresponding to an ACLR ranging from approximately −33 dBc to −36 dBc.

13. The transmitter of claim 12, wherein the clipper circuit further comprises a second adder to add the multiplier output signal and the baseband input signal to produce the correlated out-of-band noise signal to control the ACLR of the transmitter.

14. The transmitter of claim 10, wherein the clipper circuit is configured to clip the baseband input signal in accordance with a clip signal of the form $CL=\alpha \cdot RMS|x|$, where x is the baseband input signal, $\alpha$ defines the clipper limiter threshold of CL, and $\alpha$ is related to a cubic metric (CM) of the baseband input signal.

15. The transmitter of claim 14, wherein the multiplier increases the power of the correlated out-of-band noise signal to a level corresponding to an ACLR ranging from approximately −33 dBc to −36 dBc.

16. The transmitter of claim 9, wherein the peak injunction circuit comprises circuitry configured to apply an impulse function to the correlated out-of-band noise signal to cause in-band EVM degradation.

17. The transmitter of claim 16, wherein the peak injection circuit has a peak threshold $CL=\beta$ MAX $(|X|)$, where X is a baseband input signal, and $\beta$ is a function of a cubic metric (CM) of the correlated out-of-band noise signal and of the EVM of the communication device.

18. The transmitter of claim 9, wherein the clipper circuit and the peak injection circuit comprise mobile communication device circuitry, and the mobile communication device circuitry is configured to generate orthogonal frequency division multiplex (OFDM) signals.

19. The transmitter of claim 9, wherein the transmitter is part of user equipment configured to operate in a long term evolution (LTE) network.

20. The transmitter of claim 19 further comprising one or more antennas configured for transmission of the at least one OFDM signal.

21. A method of operating user equipment (UE) comprising:
producing, via a clipper circuit that receives a baseband signal, a correlated out-of-band noise signal, said clipper circuit configured for controlling the adjacent channel leakage ratio (ACLR) of a communication device, based on a clipper limiter threshold of the clipper circuit; and
Applying, via a peak injection circuit coupled to the clipper circuit for receiving said correlated out-of-band noise signal, an impulse function signal to the correlated out-of-band noise signal, said peak injection circuit further configured to control the error vector magnitude (EVM) of the UE, based on a peak threshold of the peak injection circuit,
wherein ACLR and EVM are independently controllable.

22. The method of claim 21, wherein the method further comprises providing a clipping signal configured to clip a baseband input signal in accordance with a function $CL=\alpha \cdot RMS|x|$, where x is the baseband input signal, a defines clipper circuit limiter threshold, and a is related to a cubic metric (CM) of the baseband input signal.

23. The method of claim 21, wherein the method further comprises increasing the power of the correlated out-of-band noise signal to a level corresponding to an ACLR ranging from about −33 dBc to about −36 dBc.

24. The method of claim 21, wherein the method further comprises applying the impulse function signal to the correlated out-of-band noise via the peak injection circuit signal to perform in-band EVM degradation, wherein the peak injection circuit has a peak threshold $CL=\beta$ MAX$(|X|)$, where X is a baseband input signal, and $\beta$ is a function of the CM of the of the correlated out-of-band noise signal and of the EVM of the UE.

25. A crest factor reduction apparatus comprising:
an out-of-band (OOB) distortions circuit configured to isolate and enhance out-of-band distortions of a first input signal to provide a first complex signal;
an adder and ratio circuit coupled to the OOB distortions circuit and configured to add the first input signal and the first complex signal, to obtain a desired adjacent channel leakage ratio (ACLR) in a communication device by setting a ratio of power of the first input signal to power of the first complex signal; and
a peak injection circuit coupled to the adder and ratio circuit and configured to receive a second complex signal from the adder and ratio circuit, the peak injection circuit configured to apply a peak function signal to control error vector magnitude (EVM) of the communication device,
wherein the ACLR and the EVM are independently controllable via a clipped version of the first input signal generated by a clipper circuit configured to have a clipper limiter threshold $CL=\alpha \cdot RMS|x|$, where x is the first input signal, $\alpha$ defines clipper circuit limiter threshold, and $\alpha$ is related to a cubic metric (CM) of the first input signal,
wherein the clipped version of the input signal is configured to control the ACLR, and
wherein the peak injection circuit is configured to generate an impulse function signal, the peak injection circuit configured to have a peak threshold $CL=\beta$ MAX$(|X|)$ where X is the first input signal, to control the EVM.

26. The crest factor reduction apparatus of claim 25 wherein the peak injection circuit is further configured to receive a control signal to define the impulse function signal as a function of the CM of the second complex signal.

27. A power amplifier comprising:
a clipper circuit configured to produce a correlated out-of-band noise signal to control adjacent channel leakage ratio (ACLR) of a communication device based on a clipper limiter threshold of the clipper circuit; and
a peak injection circuit coupled to the first circuitry and configured to apply an impulse function signal to the correlated out-of-band noise signal to control error vector magnitude (EVM) of the communication device,
wherein the clipper circuit is configured to generate a clipping function, and is coupled to a high-pass filter and a multiplier, and
wherein the clipper circuit is configured to receive a baseband input signal and clip the baseband input signal in accordance with a clip signal of the form $CL=\alpha \cdot RMS|x|$, where x is the baseband input signal, $\alpha$ defines the clipper limiter threshold of CL, and $\alpha$ is related to a cubic metric (CM) of the baseband input signal.

* * * * *

UNITED STATES PATENT AND TRADEMARK OFFICE
CERTIFICATE OF CORRECTION

PATENT NO. : 9,806,929 B2  
APPLICATION NO. : 14/569251  
DATED : October 31, 2017  
INVENTOR(S) : Farabegoli et al.

Page 1 of 1

It is certified that error appears in the above-identified patent and that said Letters Patent is hereby corrected as shown below:

In the Claims

In Column 14, Line 38, in Claim 11, delete "power amplifier" and insert --transmitter-- therefor In Column 15, Line 29, in Claim 21, delete "Applying," and insert --applying,-- therefor In Column 16, Line 31, in Claim 26, after "claim 25", insert --,--

Signed and Sealed this
Twenty-eighth Day of May, 2019

Andrei Iancu
*Director of the United States Patent and Trademark Office*